United States Patent [19]

Campbell

[11] 4,258,436
[45] Mar. 24, 1981

[54] MULTICHANNEL RF SIGNAL GENERATOR

[75] Inventor: Kenneth J. Campbell, Solana Beach, Calif.

[73] Assignee: The United States of America as represented by the Secretary of the Navy, Washington, D.C.

[21] Appl. No.: 62,834

[22] Filed: Aug. 1, 1979

[51] Int. Cl.³ ............................................. H04B 17/00
[52] U.S. Cl. ..................................... 375/10; 332/9 R; 331/76; 324/78 Z
[58] Field of Search ..................... 375/10, 42; 455/326; 332/1, 9, 17, 22, 40, 41; 324/78 Z; 331/76

[56] References Cited

U.S. PATENT DOCUMENTS

| | | | |
|---|---|---|---|
| 2,421,727 | 6/1947 | Thompson | 332/22 |
| 2,436,834 | 3/1948 | Stodola | 332/22 |
| 2,889,521 | 6/1959 | Levine et al. | 375/42 |
| 3,719,812 | 3/1973 | Bishop et al. | 375/10 |
| 3,987,374 | 10/1976 | Jones, Jr. | 375/42 |
| 4,047,121 | 9/1977 | Campbell | 332/9 |

Primary Examiner—Donald J. Yusko
Attorney, Agent, or Firm—Richard S. Sciascia; Ervin F. Johnston; Thomas M. Phillips

[57] ABSTRACT

A device for generating a plurality of RF signals, all possessing identical modulation characteristics. A clock source triggers an oscillator to produce a precise pulse train that is filtered and fed to a first double balanced mixer for mixing with the output of a variable frequency oscillator. This output signal is then fed to a second double balanced mixer for mixing with additional modulation inputs which may be Am, FM, PSK and FSK.

9 Claims, 1 Drawing Figure

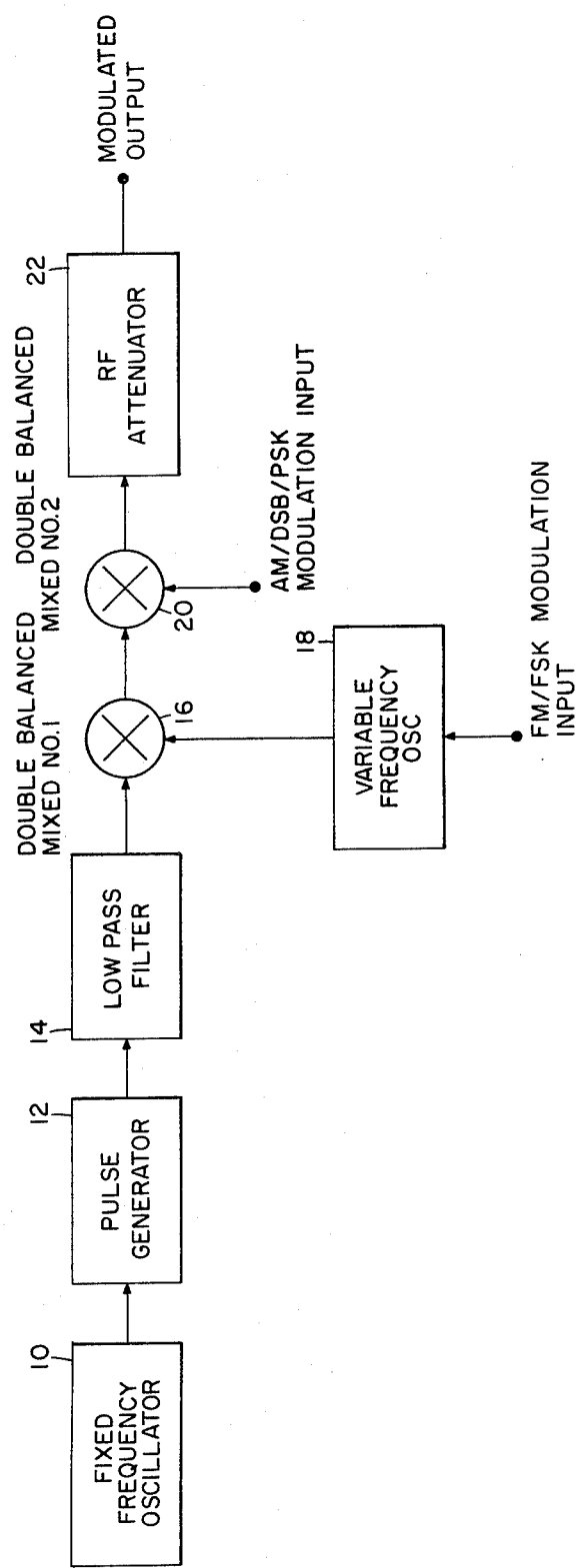

MULTICHANNEL RF SIGNAL GENERATOR

BACKGROUND OF THE INVENTION

This invention relates generally to test equipment for radio apparatus and more particularly to means for testing radio receivers without the requirement of knowing a priori the frequency to which the receiver is tuned. Present methods of generating modulated RF signals for utilization in receiver testing rely on discrete frequency generation techniques. This requires knowledge of the frequency of the receiver under test and tuning of the RF signal generator is required. Signal generators for testing receivers for various modulation formats, e.g. amplitude modulation, frequency modulation, phase shift key modulation, frequency shift key modulation, and double side band modulation, tend to be rather large and exhibit moderately high power consumption.

SUMMARY OF THE INVENTION

The present invention provides for a simple reliable means of generating a plurality of RF signals of a given modulation format, e.g. AM, FM, PSK, FSK and DSB, all RF signals exhibiting identical modulation characteristics. That is, for example, in the case of amplitude modulation, the modulation percentage would be the same for each of the RF signals generated. The present invention also provides for a simple means of generating test signals suitable for use in receiver testing without the requirement of knowing a priori the frequency to which the receiver is tuned. This technique is applicable to any receiver which can be tuned to any one of a plurality of equally spaced channels. A narrow pulse train is generated with spacing equal to the receiver channel spacing and is filtered to remove undesired high frequency components. The pulse train is fed to a first double balanced mixer where the signal is mixed with the output from a signal provided by a variable frequency oscillator which is controlled by FM or FSK modulation inputs. This modulated signal is further mixed in a second double balanced mixer with AM, PSK and DSB modulation signal inputs and provides the desired plurality of RF signals for performing the desired testing.

Accordingly, an object of the invention is the provision of a simple and reliable means of generating a plurality of RF signals of a given modulation format.

Another object of the invention is the provision of a simple means of generating test signals suitable for use in the receiver testing without the requirement of knowing a priori the frequency to which the receiver is tuned.

Another object of the invention is the provision of a simple and reliable means of generating a plurality of signals of a given modulation format, all signals exhibiting identical modulation characteristics.

Other objects and many of the attendant advantages of this invention will be readily appreciated as the same becomes better understood by reference to the following detailed description when considered in connection with the accompanying drawings wherein there is shown in the single figure a block diagram of the preferred embodiment of the invention.

DESCRIPTION OF THE PREFERRED EMBODIMENT

Referring now to the drawings wherein there is shown in the single figure a fixed frequency oscillator 10 for triggering pulse generator 12. Oscillator 10 should operate at a frequency equal to the channel spacing of receiver under test. The output of mixer 16 is fed to a second doubled balanced mixer 20 and is of the type that has the capability to vary the amplitude and phase (zero degrees or 180 degrees) of the output of mixer 16. AM, DSB and PSK modulation inputs are coupled to mixer 20 to provide the multiple modulated RF signal to attenuator 22 which is used to set the level of the RF output signal at output terminal 24.

In operation and by way of example, the signal generator is designed to operate with a receiver, operating in the 225 to 400 MHz frequency range, and which has a 25 kHz channel spacing. Fixed frequency oscillator 10 then is operating at 25 kHz. Oscillator 10 causes pulse generator 12 to output a pulsed train with a PRF of 25 kHz. The Fourier transform of this pulse train is a comb of frequency components equally spaced at 25 kHz.

The output from pulse generator 12 is fed to low pass filter 14 where undesired high frequency components are removed. If these undesired components were allowed to pass the double balanced mixer 16, unwanted frequency components would be subsequently generated.

The output of low pass filter 14 is fed to double balanced mixer 16 where it is mixed with a signal provided by variable frequency oscillator 18. If the output frequency of oscillator 18 is caused to change by applying a suitable voltage to the VCO input, the mixing process of double balanced mixer 16 causes all output frequency components to be simultaneously shifted by an amount identical to the oscillator shift. It is this control voltage which allows for variable frequency modulation schemes such as FM and FSK.

The output of mixer 16 is fed to a second double balanced mixer 20 where it is mixed with a suitable control signal. By virtue of the capability of mixer 20, this control signal allows the implementation of amplitude and phase (zero degrees or 180 degrees) modulation schemes such as AM, DSB and PSK. Balanced mixers such as model ZAD-2, manufactured by Mini Circuits Laboratory may be used as double balanced mixers 16 and 20. The output of double balanced mixer 20 which is the desired comb of modulated RF frequency components, is fed to RF attenuator 22 so that the output level to the receiver under test may be accurately controlled. Therefore, regardless of which channel the receiver under test is operating, there will be a test signal present. Also the modulation type, and amount will be the same for each of the individual comb components.

Obviously, many other modifications and variations of the present invention are possible in the light of the above teachings. It is therefore to be understood that within the scope of the appended claims the invention may be practiced otherwise than as specifically described.

What is claimed is:

1. A multichannel RF signal generator comprising:
   oscillatory pulse circuit means for providing a pulse train with a predetermined prf;

low pass filter means connected to said circuit means for removing undesired high frequency components;

first mixer circuit means having a first input coupled to the output of said filter and having a second input coupled to receive a variable frequency signal and having an output; and second mixer means having a first input coupled to the output of said first mixer means, a second input coupled to receive a variable amplitude signal and having an output signal spectrum comprising a plurality of identically modulated RF signals separated by a frequency spacing equal to the predetermined PRF;

wherein the output of the second mixer means is substantially the output of the generator.

2. The RF signal generator of claim 1 wherein said first and second mixer circuit means are double balanced mixers.

3. The RF signal generator of claim 2 wherein said second input to said first mixer circuit means is a voltage controlled oscillator.

4. The RF signal generator of claim 3 wherein said voltage controlled oscillator is controlled by frequency modulation signals.

5. The RF signal generator of claim 3 wherein said second mixer circuit means has the capability to vary the amplitude and phase of the output of said first mixer circuit means as a function of the signal applied to the second input of said second mixer circuit.

6. The RF signal generator of claim 3 wherein said voltage controlled oscillator is controlled by a frequency shift keyed modulated signal.

7. The RF signal generator of claim 1 wherein said variable amplitude signal is an amplitude modulated signal.

8. The RF signal generator of claim 1 wherein said variable amplitude signal is a double side band modulation signal.

9. The RF signal generator of claim 1 wherein said variable amplitude signal is a phase shift key modulation signal.

* * * * *